United States Patent [19]

Trenary et al.

[11] 4,334,348

[45] Jun. 15, 1982

[54] RETRO-ETCH PROCESS FOR FORMING GATE ELECTRODES OF MOS INTEGRATED CIRCUITS

[75] Inventors: Dale T. Trenary, San Jose; Allen H. Frederick, Pacifica, both of Calif.; Robert M. Whelton, Paradise Valley, Ariz.

[73] Assignee: Data General Corporation, Westboro, Mass.

[21] Appl. No.: 240,879

[22] Filed: Mar. 5, 1981

Related U.S. Application Data

[62] Division of Ser. No. 170,833, Jul. 21, 1980.

[51] Int. Cl.³ .................. H01L 21/22; H01L 21/28
[52] U.S. Cl. ............................... 29/571; 29/591; 148/187; 156/653; 156/657; 156/662
[58] Field of Search ............ 156/653, 657, 662, 661.1; 29/571, 579, 591; 148/187

[56] References Cited

U.S. PATENT DOCUMENTS

| | | | |
|---|---|---|---|
| 3,689,332 | 9/1972 | Dietrich et al. | 29/579 |
| 3,920,861 | 11/1975 | Dean | 156/653 |
| 3,951,708 | 4/1976 | Dean | 29/571 |
| 4,037,308 | 7/1977 | Smith | 29/591 |
| 4,060,427 | 11/1977 | Barile et al. | 29/579 |
| 4,063,992 | 12/1977 | Hosack | 156/653 |
| 4,176,003 | 11/1979 | Brower et al. | 156/657 |
| 4,298,402 | 11/1981 | Hingarh | 156/653 |

OTHER PUBLICATIONS

Dienes et al., "Process... Geometrics", IBM Technical Disclosure Bulletin, vol. 21, No. 9 (2/79), pp. 3628–3629.

*Primary Examiner*—Jerome W. Massie
*Attorney, Agent, or Firm*—Limbach, Limbach & Sutton

[57] ABSTRACT

A method of electrically isolating a plurality of semiconductor integrated circuit components and for forming gate elements for silicon gate transistors is disclosed whereby extremely narrow line widths can be formed which heretofore have been unattainable by practicing conventional photolithography.

8 Claims, 14 Drawing Figures

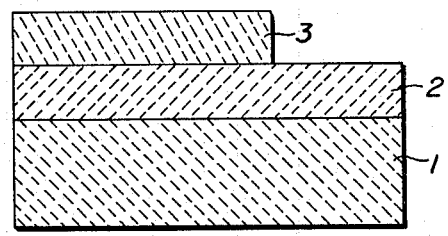
FIG._1.
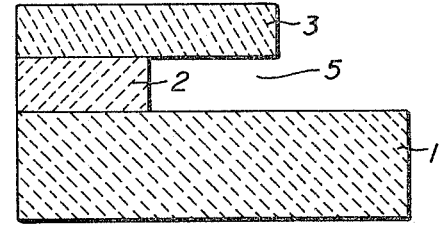
FIG._2.
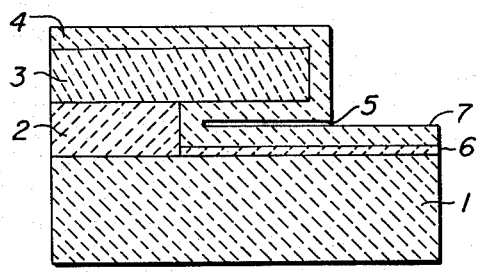
FIG._3.
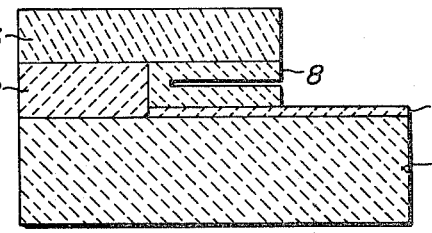
FIG._4.
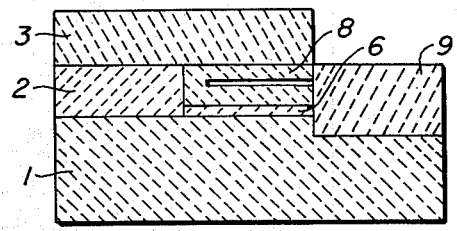
FIG._5.
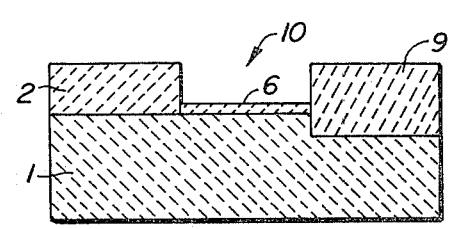
FIG._6.
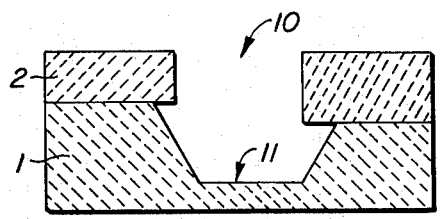
FIG._7.
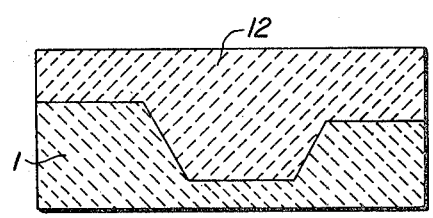
FIG._8.

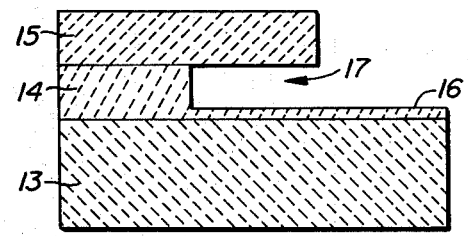
FIG.__9.
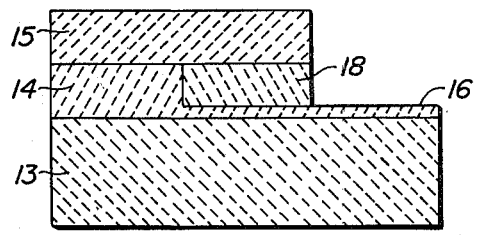
FIG.__10.
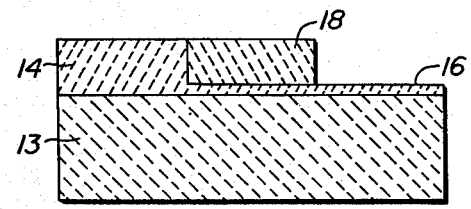
FIG.__11.
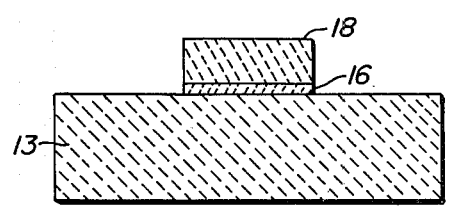
FIG.__12.
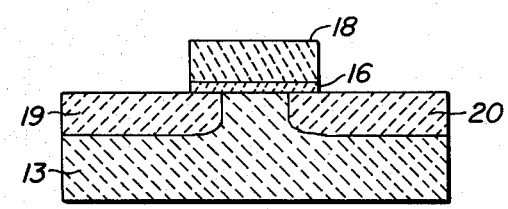
FIG.__13A.
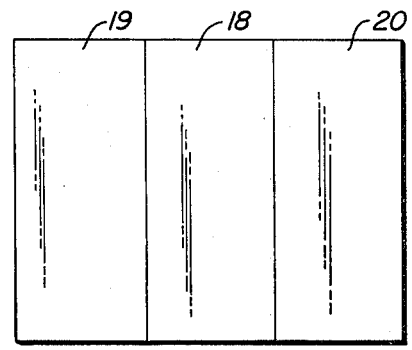
FIG.__13B.

RETRO-ETCH PROCESS FOR FORMING GATE ELECTRODES OF MOS INTEGRATED CIRCUITS

RELATED APPLICATION

This application is a division of U.S. Application Ser. No. 170,833, filed on July 21, 1980.

BACKGROUND OF THE INVENTION

There are basically two conventional methods for providing electrical isolation between integrated components on a silicon chip, namely, junction isolation and "isoplanar" oxide isolation, the latter being disclosed in U.S. Pat. No. 3,648,125. However, isoplanar oxide isolation suffers from the fact that the minimum width of the isolation regions is limited to the minimum resolvable line width of the photolithography used to fabricate the isoplanar devices. Also, as recited in co-pending application Ser. No. 170,907 filed on July 21, 1980, when the isolation groove is too large, it is difficult to fill this region by oxidizing said groove for temperatures would be required which result in serious damage to the isoplanar components unless the semiconductor structure was modified to reduce the high temperature effects.

In applicant's co-pending application Ser. No. 170,907, the difficulty in filling the isolation moat, which is desirable in applying electrical interconnects to the integrated circuit, was overcome by employing an electrically insulative resin which could be applied to the silicon body at a substantially lower temperature than that required for the formation of silicon oxide. A preferred resin was thought to be a polyimide. However, it was recognized in the present invention that the isolation problem could be solved alternatively by etching grooves in the semiconductor body which are so narrow in width that the growth of oxide on the groove walls would not require subjecting the integrated circuit to high temperatures for long periods of time. Before the present invention, however, it was impossible to fabricate such narrow grooves due to the limitations in photolithography.

Photolithography has also been used in constructing electrical devices of fairly narrow widths. Examples of such devices are resistors, diodes, and gate elements for silicon gate MOSFET transistors used in integrated circuits. It was recognized that if the gate elements could be reduced in size, more active elements could be placed upon a single silicon chip, thereby reducing overall cost of the integrated circuit. The reduction in area also produces a reduction of parasitic capacitance thereby reducing minimum response times of the integrated circuit elements. Furthermore, if one were able to fabricate gate elements for silicon gate transistors having shorter channels, the MOS transistors would possess exceptional speed with lower threshold voltages.

As stated previously, the desired results, as outlined above, are not achievable when relying on conventional photolithography. Under optimum conditions using ultra-violet light and negative photoresists, the minimum resolvable line width in conventional photolithography is approximately four microns (40,000 Å). By using a positive photoresist, this minimum can be reduced to the range of two to three microns. Recently, electron beam photolithography has produced minimum line widths of one micron. Also, as recognized in U.S. Pat. No. 3,648,125, the use of photoresist masking has the further disadvantage of presenting pin hole imperfections to the photo-sensitive material which can produce a number of unacceptable results, the nature of which depend upon where the pin hole defects appear on the integrated circuit.

It is an object of the present invention to provide a means for electrically isolating active components on an integrated circuit without the disadvantages as outlined above.

It is a further object of the present invention to provide a method for constructing electrical devices of narrow widths.

It is yet another object of the present invention to provide isolation regions which are narrower than those achievable through the use of conventional photolithography.

It is still another object of the present invention to provide a means for fabricating isolation widths of approximately 1,000–20,000 Å.

It is yet a further object of the present invention to produce gate elements for silicon gate transistors having exceptional speed due to short channels and low capacitance.

These and further objects of the present invention will be more fully appreciated when considering the following description and drawings in which:

BRIEF DESCRIPTION OF THE DRAWINGS

FIGS. 1 to 8 are cross-sectional plan views of the processing steps of the present invention; and FIGS. 9 through 13B are fabrication steps showing the present invention in the fabrication of a silicon gate MOSFET transistor.

SUMMARY OF THE INVENTION

Broadly speaking, the present invention deals with a method of forming a narrow gap in a material comprising:

A. forming a first masking layer upon the material;

B. forming a second masking layer upon the first masking layer;

C. forming a retro-etched area by partially retro-etching the first masking layer below the second layer;

D. substantially filling the retro-etched area with a masking layer to mask said material below the retro-etched area;

E. forming a third masking layer on said material not previously covered by the first masking layer or retro-etched area;

F. removing the second masking layer and masking layer within said retro-etched area; and G. forming a gap in said material between said first and third masking layers.

By following the steps outlined above, an extremely narrow gap can be formed in a material, such as a semiconductor substrate, without the restrictions of conventional photolithography. By following these steps, it is apparent that the width of the narrow gap is a direct function of the extent of retro-etching. The same process of establishing a retro-etched area and backfilling that area with a later defined material can also be used to form a narrow gate upon a semiconductor body to produce, for example, an MOS transistor. More specifically, the narrow gate can be formed by:

A. forming a first masking layer upon the semiconductor body;

B. forming a second masking layer upon the first masking layer;

C. forming a retro-etched area by partially retro-etching the first masking layer below the second masking layer;

D. substantially filling the retro-etched area with a material forming the narrow gate; and E. removing the first and second masking layers.

As a means of illustration, the present invention will be described by referring to FIGS. 1 to 13B wherein typical processing materials are described in fabricating isolation regions and an MOS transistor within silicon bodies. It should be understood, however, that these materials are recited only for the purpose of illustration and the present invention is not to be construed as being limited to those materials specifically recited.

For the sake of simplicity, FIG. 1 depicts a silicon substrate 1 without active elements shown therein. However, silicon substrate 1 may have prior diffusions or epititaxial layers as shown in U.S. Pat. No. 3,648,125.

Upon layer 1 is grown a layer of silicon dioxide 2 and a layer of silicon nitride 3 placed thereon. In arriving at the structure shown in FIG. 1, the silicon nitride layer has been partially etched to expose some of the silicon dioxide layer 2. The silicon nitride can be etched by any known prior art method such as the use of phosphoric acid to wash away unmasked areas.

Turning to FIG. 2, silicon dioxide layer 2 can then be partially removed to form retro-etched area 5. The amount of retro-etching as shown in FIG. 2 will eventually become the width of the isolation region during subsequent fabrication steps. Thus, the amount of silicon dioxide which is removed to form retro-etched area 5 should be accurately controlled so that the size of the isolation region can be pre-selected and maintained with uniform accuracy. It has been found that maximum control is achieved by exposing the structure to a buffered oxide etch for a specific period of time. A typical buffered etch consists of NH$_4$F:HF and it has further been found that diluting this etchant at a ratio of approximately 6 parts NH$_4$F to 1 part HF etches at a rate that can be readily controlled by an operator.

FIG. 3 shows the culmination of several processing steps. At the outset, oxide layer 6 is grown over the top surface of the silicon substrate to provide a base for later silicon nitride deposition. The deposit of silicon nitride over bare silicon is to be avoided as the nitride will react with the silicon substrate. After oxide layer 6 is formed, a further coating of silicon nitride, shown as layers 4 and 7, is applied which acts to coat pre-existing silicon nitride layer 3 and fill retro-etch area 5. In practicing the present invention, it is desirable to coat all exposed surfaces of retro-etch area 5. It has been found that low pressure chemical vapor deposition (LPCVD) of silicon nitride most favorably permits the nitride to be applied within the rather restrictive surfaces making up retro-etch area 5. Properly applied, the thickness of the silicon nitride within retro-etch area 5 should be approximately twice the thickness of the nitride at 4 and at 7, such that the retro-etched region 5 becomes substantially filled with silicon nitride.

The next process step of the present invention is shown in FIG. 4 wherein silicon nitride is removed from the top surface of the wafer. From previous processing steps, it is noted that the thickness of layers 4 and 7 are approximately the same, and it is this thickness which is removed during this silicon nitride etching step. The etching can be accomplished by any well known means such as by using phosphoric acid which would result in a structure as shown in FIG. 4. It should be obvious that the processing step as shown in FIG. 4 results in the filling of retro-etch area 5 with silicon nitride 8. The significance of the filling of the retro-etch area will be more fully appreciated in further processing steps.

FIG. 5 shows the growing of a silicon dioxide region 9 into silicon body 1. This can be done by any known technique such as by thermal oxidation. Because silicon dioxide will not grow where the wafer has been masked by silicon nitride, the growth of silicon dioxide is selective and results in only those areas pre-selected as being without silicon nitride deposition. After the oxide is formed, all of the silicon nitride can be removed resulting in a structure shown in FIG. 6. Area 10 is of a width which is co-extensive with the width of retro-etch area 5. Thus, by selecting the amount of retro-etching, the width of area 10 can be pre-selected.

The structure shown in FIG. 6 can then be subject to an oxide etch to remove only layer 6 in area 10. Once this is accomplished, the silicon substrate can be etched to produce the void or groove 11 as shown in FIG. 7. Because of the relatively small dimension of said groove, it can be completely filled by thermal oxidation producing the structure shown in FIG. 8 having a silicon body 1 and oxide 12 completely filling and surrounding the insulating groove. Again, the thickness of the groove was in no way dictated by photolithography, but was fabricated merely by a retro-etch step as depicted in FIG. 2. The width of the groove can thus be of virtually any pre-selected dimension heretofore impossible by practicing prior art techniques.

As stated previously, the present invention can also be employed to prepare such devices as silicon gate MOSFET transistors. It has been recognized that it would be advantageous to reduce the width of the gate of a MOSFET transistor which would result in a reduction of parasitic capacitance, thereby reducing minimum response times of the integrated circuit. By reviewing FIGS. 9 through 13B, the use of the present invention in such an application can be readily visualized.

FIG. 9 corresponds to previously discussed FIG. 2 whereby silicon body 13 has been coated with silicon dioxide layer 14 and overcoated by silicon nitride layer 15. The structure has been retro-etched producing retro-etch area 17, said retro-etch area being separated from the silicon body by silicon dioxide layer 16.

Turning to FIG. 10, the culmination of several processing steps are shown, the final structure of which being quite close physically to that shown in FIG. 4. Instead, however, of coating the structure shown in FIG. 9 with silicon nitride and etching away the nitride with phosphoric acid to fill the retro-etch area, in this case polysilicon was used in the place of nitride. Thus, the coating and etching steps result in a silicon body 13 which has been overcoated with silicon dioxide layers 14 and 16 and silicon nitride layer 15 having a retro-etch area 17 completely filled with polysilicon 18. The actual processing steps are identical to those disclosed previously when discussing FIG. 4.

FIG. 11 shows the removal of silicon nitride layer 15. After this is done, the silicon dioxide can be etched away by any known technique, such as by employing an unbuffered oxide etch, resulting in a structure shown in FIG. 12. It should be noted that the oxide which was masked by the polysilicon remains on the substrate.

The final MOSFET transistor is fabricated by doping unmasked areas with phosphorus or other n-type dopant, the final structure shown in cross-section in FIG. 13A and as a top view in FIG. 13B having doped phosphorus areas 19 and 20, which are separated by gate area 18.

Prior to the present invention, gate 18 could only be as narrow as photolithography would allow. By practicing the present invention, this gate can be as narrow as the pre-selected retro-etch area 17. Thus, instead of merely forming isolation grooves, the present invention can also be used to form diffused areas to produce devices such as resistors and diodes.

To summarize the above illustration, active components on a silicon body can be isolated by:

A. forming a silicon dioxide layer upon the silicon body;

B. forming a silicon nitride layer upon the silicon dioxide layer, masking, and etching the silicon nitride layer;

C. forming a retro-etched area by etching the silicon dioxide layer to a pre-determined area under the silicon nitride layer;

D. forming an additional silicon nitride layer over the silicon body to substantially fill the retro-etched area;

E. removing the silicon nitride as applied in step D except in the retro-etched area;

F. forming a layer of silicon dioxide on the silicon body in areas not covered by the silicon nitride;

G. removing all remaining silicon nitride;

H. etching any remaining silicon dioxide to expose the silicon body in the retro-etched area; and I. etching the silicon body to form an isolation groove.

A narrow doped region on a silicon body can be fabricated in order to produce such elements as resistors and diodes by following the steps outlined above, except that step I would be replaced by the step of diffusing a dopant into the silicon body in the exposed retro-etched area. As stated previously, the present method can also be used to form an MOS transistor on a silicon body having an extremely narrow gate by repeating steps A, B and C from above and then:

D. forming a polysilicon layer over the silicon body to substantially fill the retro-etched area;

E. removing the polysilicon as applied in step D except in the retro-etched area;

F. removing the remaining silicon nitride;

G. removing all silicon dioxide in the areas not covered by the polysilicon; and H. diffusing a dopant into the silicon body in the areas not covered by the polysilicon.

By the use of prior art photolithography, through the use of ultraviolet light and negative photoresist, the minimum resolvable line width is limited to about four microns (40,000 Å) while by using a positive photoresist, the minimum line width can be reduced to the range of two to three microns. Recently, electron beam photolithography has produced minimum line widths of approximately one micron. By practicing the present invention, the retro-etched width can be made considerably less than 20,000 Å.

Referring back to the use of the present invention to fabricate isolation grooves, it has been found that once the grooves are formed, they should be filled in order to present a substantially planar surface for later electrical connections. With wide isolation grooves it is difficult to grow oxide to substantially fill said grooves for the temperatures necessary to thermally grow such an oxide would to a large degree adversely affect the active components of the integrated circuit unless the semiconductor structure was modified to reduce the high temperature effects. With the narrow grooves of the present invention, however, thermal oxidation of the walls of the grooves, for the first time, becomes a realistic approach. Alternatively, the isolation grooves can be filled with low pressure chemical vapor deposited polysilicon. Generally, before filling the groove with polysilicon, a thin layer of silicon dioxide is first grown on the groove walls. This technique is shown in co-pending application Ser. No. 170,907, filed July 21, 1980.

It should also be obvious from viewing the drawings presented herein that a thin layer of silicon dioxide is left over the silicon body. This thin layer, which is present in the retro-etched area, is shown as layer 6 and 16. Its purpose in constructing the isolation grooves is to isolate the silicon body from the silicon nitride. In producing the MOS transistor, its function is to separate the polysilicon from the silicon body.

It will be apparent to those skilled in the semiconductor manufacturing art that various adaptations and modifications of the invention as described herein can be made while remaining within the scope of the present invention.

What is claimed is:

1. A method of forming a narrow gate upon a semiconductor body comprising:

A. forming a first masking layer upon the semiconductor body;

B. forming a second masking layer upon the first masking layer;

C. forming a retro-etched area by partially retro-etching the first masking layer below the second masking layer;

D. substantially filling said retro-etched area with a material forming the narrow gate; and E. removing the first and second masking layers and material in non-retro-etched area leaving behind on said semiconductor body, only said material in the form of a narrow gate in said retro-etched area.

2. The method of claim 1 wherein said first masking layer comprises silicon dioxide.

3. The method of claim 1 wherein said second masking layer comprises silicon nitride.

4. The method of claim 1 wherein the material substantially filling the retro-etched area comprises polysilicon.

5. The method of claim 1 which further comprises diffusing a dopant into the semiconductor body in areas adjacent the retro-etched area.

6. A method of forming a MOS transistor within a silicon body comprising:

A. forming a silicon dioxide layer upon the silicon body;

B. forming a silicon nitride layer upon the silicon dioxide layer;

C. forming a retro-etched area by etching the silicon dioxide layer to a predetermined area under the silicon nitride layer;

D. forming a polysilicon layer over the silicon body to substantially fill the retro-etched area;

E. removing the polysilicon as applied in step D except in the retro-etched area;

F. removing the remaining silicon nitride;

G. removing all silicon dioxide in the areas not covered by the polysilicon; and H. diffusing a dopant into the silicon body in the areas not covered by the polysilicon.

7. The methods of claim 6 wherein the width of the retro-etched area is less than approximately 20,000 Å.

8. The method of claim 6 wherein a thin layer of silicon dioxide is present in the retro-etched area on the silicon body.

* * * * *